United States Patent [19]
Tanaka et al.

[11] Patent Number: 5,585,332
[45] Date of Patent: Dec. 17, 1996

[54] PROCESS FOR PREPARING A PEROVSKITE BI-CONTAINING SUPERCONDUCTOR FILM

[75] Inventors: Atsushi Tanaka, Sagamihara; Nobuo Kamehara, Isehara; Koichi Niwa, Tama, all of Japan

[73] Assignee: Fujitsu Limited, Kawasaki, Japan

[21] Appl. No.: 378,087

[22] Filed: Jan. 25, 1995

Related U.S. Application Data

[60] Continuation of Ser. No. 914,549, Jul. 16, 1992, abandoned, which is a division of Ser. No. 565,209, Aug. 9, 1990, Pat. No. 5,141,917, which is a continuation of Ser. No. 442,624, Nov. 29, 1989, abandoned.

[30] Foreign Application Priority Data

| Nov. 29, 1988 | [JP] | Japan | 63-301637 |
| May 9, 1989 | [JP] | Japan | 1-114150 |
| Jun. 6, 1989 | [JP] | Japan | 1-144502 |
| Jun. 6, 1989 | [JP] | Japan | 1-144503 |

[51] Int. Cl.$^6$ .................................................. B05D 5/12
[52] U.S. Cl. .................... 505/473; 505/474; 505/475; 505/501; 505/731; 505/732; 505/742; 427/62
[58] Field of Search .................. 505/473, 474, 505/475, 501, 731, 732, 742; 427/62, 63

[56] References Cited

FOREIGN PATENT DOCUMENTS

| 63-233071 | 9/1988 | Japan . |
| 63-241824 | 10/1988 | Japan . |
| 63-241825 | 10/1988 | Japan . |
| 63-276823 | 11/1988 | Japan . |

OTHER PUBLICATIONS

Chemical & Engineering News, vol. 66, No. 20, 16 May 1988, pp. 24–29, Washington, DC, US; R. Dagani: "New class of superconductors pushing temperatures highe."

Applied Physics Letters, vol. 53, No. 18, 31 Oct. 1988, pp. 1759–1761, American Institute of Physics, New York, NY, US; R. Ramesh et al.: "Microstructure of Pb–modified Bi–Ca–Sr–Cu–O superconductor."

Nature, vol. 332, 10 Mar. 1988, p. 138; Z. Z. Sheng et al.: "Bulk superconductivity at 120 K in the Tl–Ca/Ba–Cu–O system."

MRS Int'l. Mtg. on Adv. Mats., vol. 6, 1989, pp. 845–850, Materials Research Society, A. Tanaka et al.: "Superconducting thin films on sintered alumina substrates."

Solid State Communications, vol. 70, No. 8, 1989, p. 829, S. K. Dew et al.: "Optimization of Pb–Bi–Sr–Ca–Cu–O thin films for zero resistance above look."

Appl. Phys. Lett. 54 (14), 3 Apr. 1989, pp. 1362–1364; A. Tanaka et al.: "Pb–doped Bi–Sr–Ca–Cu–O thin films."

Appl. Phys. Lett. 54 (19), 8 May 1989, pp. 1929–1931; S. K. Dew et al.: "Effects and loss of lead in doped Bi–Sr–Ca–Cu–O films."

Appl. Phys. Lett. 55 (12), 18 Sep. 1989, pp. 1252–1254; A. Tanaka et al.: "Composition dependence of high Tc phase formation in Pb–doped Bi–Sr–Ca–Cu–O thin films."

(List continued on next page.)

*Primary Examiner*—Roy V. King
*Attorney, Agent, or Firm*—Staas & Halsey

[57] ABSTRACT

A perovskite type superconductor film having a high content, almost a single phase, of the high Tc phase is formed by the steps of: depositing at least one first film of a first material (e.g., a composite oxide of Bi-Sr-Ca-Cu-O system or Tl-Ba-Ca-Cu-O system) constituting a perovskite type superconductor over a substrate; depositing at least one second film of a second material containing an oxide or element ($Bi_2O_3$, $Tl_2O_3$, $PbO_x$, etc., particularly $PbO_x$) having a vapor pressure of more than $10^{-4}$Pa at 800° C. at least as a main component over the substrate; to thereby form a stack of the first and second films; and heat treating the stack of the first and second films to form the perovskite type superconductor film on the substrate. Further, preferred compositions of the as-deposited films or stack are determined.

7 Claims, 10 Drawing Sheets

OTHER PUBLICATIONS

Paserin et al, "Vacuum deposition of multilayer $B_i$—$C_a$—$S_r$—$C_u$—O superconducting thin films", Appl. Phys. lett. 53(7) Aug. 1988 pp. 624–625.

Takano et al, "High–Tc phase promoted and stabilized in the $B_i$, $P_b$—$S_r$—$C_a$—$C_u$—O system", Jpn. J. Appl. Phys. 27(6) Jun. 1988 pp. 1041–1043.

Yotsuya et al, "Fabrication of Bi(Pb)SrCaCuO Thin film of high–Tc phase", Jpn. J. Appl. Phys. 28(6) Jun. 1989 pp. L972–974.

Hazen et al, "Superconductivity in the high–Tc $B_i$—$C_a$—$S_i$—$C_u$—O system: Phase Identification", Phys. rev. lett. 60(12) Mar. 1988 pp. 1174–1177.

PROCESS FOR PREPARING A PEROVSKITE BI-CONTAINING SUPERCONDUCTOR FILM

This application is a continuation of application Ser. No. 07/914,549, filed Jul. 16, 1992 (now abandoned), which in turn is a divisional of application Ser. No. 07/565,209, filed Aug. 9, 1990 (now U.S. Pat. No. 5,141,917), which again in turn is a continuation of application Ser. No. 07/442,624, filed Nov. 29, 1989 (now abandoned).

BACKGROUND OF THE INVENTION

1. Field of the Invention

The present invention relates to a process for preparing a perovskite type superconductor film, particularly Bi-(Pb)-Sr-Ca-Cu-O and Tl-Ba-Ca-Cu-O systems with a high content of the high Tc phase, i.e., having a high critical temperature Tc of superconductivity.

2. Description of The Related Art

The research and development of high temperature superconductive materials exhibiting superconductivity at above the boiling point of liquid nitrogen is proceeding rapidly, and investigations into practical applications thereof are also underway. Particularly, superconductors having a critical temperature Tc above 100K are under investigation because they advantageously have a large temperature margin for liquid nitrogen application, theoretically have an increased critical current density Jc and critical magnetic field Hc.

Known superconductors having a critical temperature Tc above 100K are Bi-Sr-Ca-Cu-O and Tl-Ba-Ca-Cu-O systems. These Bi- and Tl- systems have the advantages of a resistance to water and oxygen degradation. Nevertheless, the Bi- and Tl-system superconductors have a disadvantage in that a low Tc phase is easily formed and the formation of single high Tc phase is difficult. The Bi-system is typically a mixed phase of a low Tc phase with a critical temperature Tc of about 80K and a high Tc phase with a Tc of about 110K. The Tl-system is typically a mixed phase of a low Tc phase with a critical temperature Tc of about 105K and a high Tc phase with a Tc of about 125K. The formation of isolated high Tc phase has not been accomplished.

A new high Tc Bi-Sr-Ca-Cu-O system superconductor was found by Maeda et al (Jpn. J. Appl. Phys. 27, 1988, L209). It was also found that this system contains three superconducting phases represented by the formula $Bi_2Sr_2Ca_{n-1}Cu_nO_x$. A first phase corresponding to n=1 in the formula and having a Tc of 7K, a second phase corresponding to n=2 and having a Tc of 80K, and a third phase corresponding to n=3 and having a Tc of 105K. With the increase of n from 1 to 3, the number of CuO layers in the crystal structure is increased from 1 to 3 and the c axis of the crystal is elongated from 2.4 nm to 3.0 nm to 3.7 nm.

Takano et al reported that the volume fraction of the high Tc phase is increased by partially substituting Pb for Bi (Jpn. J. Appl. Phys. 27, 1988, L1041), but the role of Pb is not clear at present.

In a typical process for preparing a superconductor film of, for example, a Bi-Sr-Ca-Cu-O system superconductor, an oxide is deposited on a substrate of MgO, $SrTiO_3$, etc. by sputtering, evaporation, etc., followed by a heat treatment to react the deposited film, to thereby form a superconducting film. There is a need to provide a process for reproduciblly forming a single phase film, having a high Tc phase, of the Bi-(Pb)-Sr-Ca-Cu-O and Tl-Ba-Ca-Cu-O systems.

SUMMARY OF THE INVENTION

The present invention provides a process for preparing a perovskite type superconducting film, comprising the steps of: depositing at least one first film of a first material constituting a perovskite type superconductor over a substrate; depositing at least one second film of a second material containing an oxide having a vapor pressure of more than $10^{-4}$ Pa at 800° C. at least as a main component over the substrate, thereby forming a stack of the first and second films; and heat treating the stack of the first and second films to form the perovskite type superconductor film on the substrate.

Particularly, the present invention provides a process for preparing a perovskite type superconductor film on a substrate, comprising the steps of: depositing a composite oxide film of Bi-Sr-Ca-Cu-O system having a thickness of 50 to 2,000 nm on a substrate; optionally depositing a $Bi_2O_3$ film having a thickness of 5 to 20 nm on the first composite oxide film at a first temperature of 200° to 500° C.; depositing a PbO film having a thickness of 5 to 20 nm on the first composite oxide film at a second temperature less than 500° C.; optionally depositing a CuO film having a thickness of 5 to 30 nm at a third temperature of 200° to 500° C.; repeating the deposition of the composite oxide, $Bi_2O_3$ if necessary and PbO films to form a stack of the composite oxide film, the $Bi_2O_3$ film if present, the CuO film if present, and the PbO film on the substrate, the stack having a top film of the composite oxide film; and heat treating the stack at a third temperature of 835° to 870° C. higher than the first and second temperature to form a film of a Bi-(Pb)-Sr-Ca-Cu-O perovskite type superconductor on the substrate.

The present invention also provides a process for preparing a perovskite type superconductor film on a substrate, comprising the steps of: depositing a composite oxide film of Tl-Ba-Ca-Cu-O system having a thickness of 50 to 2,000 nm on a substrate; depositing a $Tl_2O_3$ film having a thickness of 10 to 20 nm on the first composite oxide film at a first temperature of 200° to 500° C.; repeating the deposition of the composite oxide and $Tl_2O_3$ films to form a stack of the composite oxide and $Tl_2O_3$ films on the substrate, the stack having a top film of the composite oxide film; and heat treating the stack at a second temperature of 750° to 890° C. higher than the first temperature to form a film of a Tl-Ba-Ca-Cu-O perovskite type superconductor on the substrate.

By the present invention there is also provided an optimum composition for forming high Tc phase $Bi_2\ Sr_2\ Ca_2\ Cu_3\ O_x$ in Pb-doped Bi system thin films. Although it was reported that doping with Pb enhanced the high Tc phase formation in the bulk system, the present inventors found that in thin films, doped Pb easily evaporates during post-annealing or sintering and a larger amount of Pb is necessary to synthesize the high Tc phase. Further, the present inventors optimized the Cu content in the deposited film. A slightly excess Cu effectively decreases the low Tc phase.

Thus, a preferred composition of the as-deposited film before post-annealing is a ratio of Bi/Pb of 1/0.5–1.5, more preferably 1/0.6–0.9, and a ratio of Sr/Cu of 1.5–1.7. Also a most preferred composition is Bi:Pb:Sr:Ca:Cu of 0.8–1.1:0.5–1.0:1:0.9–1.1:1.5–1.7.

DESCRIPTION OF THE PREFERRED EMBODIMENTS

Bi-Sr-Ca-Cu-O and Tl-Ba-Ca-Cu-O system superconductors comprise at least four metal elements, and as a result, it is difficult to adjust the composition to a desired value. Further, metal elements having a relatively high vapor pressure, such as Bi, Pb and Tl, tend to be lost from a deposited film, e.g., by evaporation during the deposition and annealing of the film. The amounts of the loss of the elements in the deposited film are changed by the substrate temperature, the deposition rate of the film and the annealing temperature. Therefore, the composition of the film is not reproducible.

The vapor pressure (P) of an oxide is represented by the formula: $\log P = AT^{-1} + B\log T + C \times 10^{-3} \times T + D$ where T stands for the absolute temperature (K), and A, B, C and D are constants ("Metal Data Handbook", p86). Examples of the vapor pressure of elements and oxides at 1073K (800° C.) are shown below:

| Element Oxide | A | B | C | D | log P (mm Hg) | $P_0$ (Pa) |
|---|---|---|---|---|---|---|
| PbO | −13480 | −0.92 | −0.35 | 14.36 | −1.366 (−8.507 at 400° C.) | 0.057 |
| Pb | −10130 | −0.985 | 11.16 | | −1.266 | 0.072 |
| Bi | −10400 | −1.26 | | 12.35 | −1.16 | 0.092 |
| Cu | −17700 | −0.86 | 12.29 | | −6.812 | $2 \times 10^{-7}$ |

Figure 1:
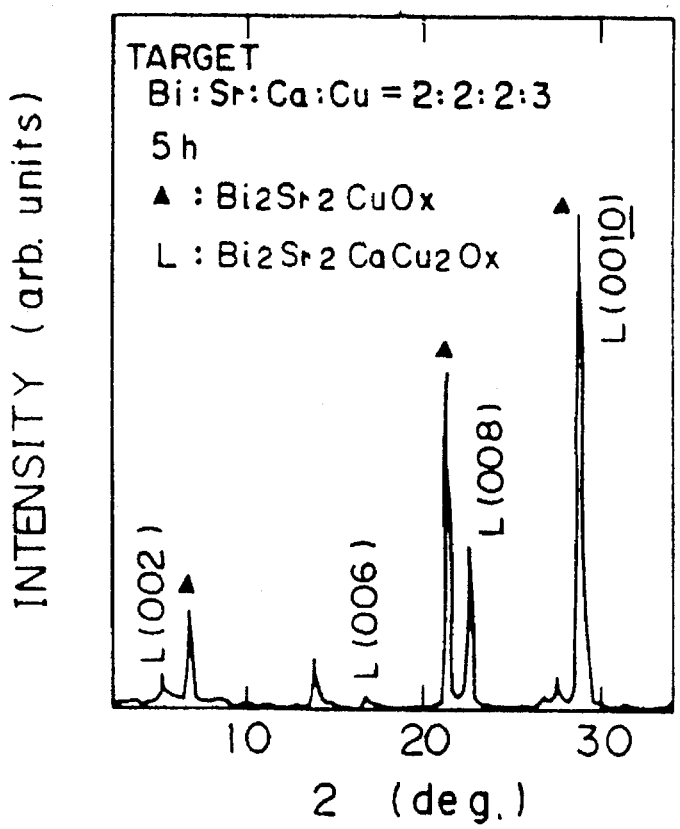
FIGS. 1 and 2 show X-ray diffraction patterns of Bi-Sr-Ca-Cu-O and Bi-Pb-Sr-Ca-Cu-O superconductor films in the prior art.

FIG. 1 shows a X-ray diffraction pattern of a Bi-Sr-Ca-Cu-O film formed in accordance with the prior art. A sintered oxide target of $Bi_2Sr_2Ca_2Cu_3O_x$ was prepared by firing a mixture of oxides in air at 800° C. for 24 hours. A film was deposited by RF magnetron sputtering on a MgO substrate from the above target heated to 400° C. under 1 Pa, and the obtained film having a thickness of 1 μm was then heat treated at 875° C. for 5 hours. The thus-obtained film compromised of, as seen from FIG. 1, $Bi_2Sr_2CuO_x$ and $Bi_2Sr_2CaCu_2O_x$ (the low Tc phase having a Tc of 80K). The film had a composition of Bi:Sr:Ca:Cu=0.63:1.00:1.07:1.40 by EPMA (electron probe micro analysis), which was greatly deviated from the stoichiometric composition of the high Tc phase ($Bi_2Sr_2Ca_2Cu_3O_x$) having a Tc of 110K.

When Pb was added to the above target, so that the Pb-doped target had a composition of $Bi_2Pb_{0.4}Sr_2Ca_2Cu_3O_x$, and the deposited film was heat treated at 850° C. for 12 hours, the resultant film contained a high Tc phase. However, the volume fraction was small (see FIG. 2). FIG. 3 shows the electric resistantivity of the film rs. the temperature, in which the on-set is seen to be around 110K but zero resistance is not achieved until 75K. It was when an appropriate amount of Pb is added to a bulk sample of Bi-Sr-Ca-Cu-O, a high volume fraction of the high Tc phase is obtainable, by Koyama et al (JJAPL. vol. 27, pp-L1861-L1863), a sufficient amount of Pb was not added to the deposited film because Pb is easily evaporated during the deposition and annealing of the film.

The present invention resolves the above problem by independently forming a layer containing, at least as a main component, an oxide or element having a high vapor pressure of more than $10^{-4}$ Pa, particularly more than $10^{-2}$, at 800° C. such as $Bi_2O_3$, $PbO_x$ or $Tl_2O_3$, in a stack of oxide layers, to have an average composition close to a desired value whereby, after heat treating the stack for a short time, a superconductor film comprising a phase having a structure containing three CuO planes in a ½ unit, the superconductor film having a high critical temperature and a high critical current density, is thus obtained.

Thus, the present invention provides a process for preparing a Bi-(Pb)-Sr-Ca-Cu-O or Tl-Ba-Ca-Cu-O system superconductor film, comprising the steps of: depositing at least one first film of a first oxide constituting a perovskite type superconductor over a substrate at a first temperature; depositing at least one second film containing a second oxide having a vapor pressure of more than $10^{-4}$ Pa at 800° C. at least as a main component of the second film over the substrate, thereby forming a stack of the first and second oxide films; and heat treating the stack of the first and second oxide films at a second temperature higher than the first temperature in an atmosphere containing oxygen to form the perovskite type superconductor film on the substrate.

At least one oxide having a vapor pressure of more than $10^{-4}$ Pa at 800° C. is independently deposited because, at said first temperature for said deposition if such a high vapor pressure oxide is deposited at this temperature, and at said second temperature for said heat treatment, said oxide or the element of said oxide is easily evaporated and the composition of the film is remarkably varied, and therefore a compensation of the evaporating component is necessary, in order to obtain a high Tc phase superconductor with the stoichiometric composition.

The process described herein may be applied to other superconductors. Important examples thereof are $Bi_2(Sr_{1-x}Ca_x)_mCu_nO_z$, where $0<x<1$, m=3 and n=2, or m=4 and n=3, and z>0; and $Tl_1(Ba_{1-x}Ca_x)_mCu_nO_z$ or $Tl_2(Ba_{1-x}Ca_x)_mCu_nO_z$, where $0<x<1$, $m=3$ and $n=2$, or $m=4$ and $n=2$, or $n=3$, and $z>0$, or a composite of these last two. In these superconductors, it is considered that the low Tc phase has a composition close to $m=3$ and $n=2$ and the high Tc phase has a composition close to $m=4$ and $n=3$. It should be noted that the average composition of the high Tc phase superconductor may show some variation (at largest 10%) from the stoichiometric values. The perovskite type superconductor of the present invention also includes the superconductor having the above composition, $Bi_2(Sr_{1-x}Ca_x)_mCu_nO_z$, in which a part of an element or elements thereof is replaced by Pb and/or Pb is further added. Such superconductors may be represented by the formula: $Bi_{2-y}Pb_r(Sr_{1-x}Ca_x)_4Cu_3O_z$ where $0<x<1$, $y>0$, $r>0$, and $z>0$. Also, in the above Tl-system, a part of an element or elements thereof may be replaced by Pb.

The oxides or elements having a vapor pressure of higher than $10^{-4}$ Pa at 800° C. in the above superconductors are $Bi_2O_3$(Bi), $PbO_x$(Pb), and $Tl_2O_3$(Tl). These oxides are preferably deposited at a temperature (for example, less than 500° C.) lower than a temperature (typically 750°–890° C.) of a heat treatment for forming a perovskite type superconductor. A preferable temperature for depositing the oxides, particularly PbO, is 200° to 500° C., more preferably 350° to 400° C. At a temperature higher than 500° C., evaporation occurs, and at a temperature lower than 200° C., the adhesion of the deposited oxide film is poor.

In another aspect of the present invention, the film of Bi-(Pb)-Sr-Ca-Cu-O system as deposited and before the heat treatment should have an average composition with a ratio of Bi/Pb of 1/0.5–1.5, more preferably 1/0.6–0.9. In the prior art, a ratio of Bi/Pb of about 1.8/0.34 (i.e., 1/0.189) is thought preferable as a starting material for forming a bulk superconductor (Kawai et al, Jpn. J. appl. Phys. 27, 1988, L1476). Nevertheless, the present inventors found o that Pb or $PbO_x$ in a film is preferentially and greatly evaporated during a heat treatment of the stack, and the high Tc phase is formed mainly when Pb remains in the film after deposition, and therefore, to form a high Tc phase superconductor film, Pb is necessary in an as-deposited film in an amount more than the amount adequate for bulk samples. But if too much Pb is in the as-deposited film, the film is partially fused during the heat treatment and the heat treated film phase separated.

In addition to Pb doping, it is found that an Sr/Cu ratio of 1/1.5–1.7 is desired. In this case, the most preferred composition of the as-deposited film can be expressed by a ratio of Bi:Pb:Sr:Ca:Cu=0.8–1.1:0.5–1.0:1:0.9–1.15:1.5–1.7. An excess amount of CuO is preferred because the high Tc phase is more easily formed when an excess amount of CuO is present.

CuO may be deposited as a separate CuO film in a stack of films, as the above described element or oxide having a high vapor pressure.

The deposition of the oxides may be performed by physical vapor deposition such as sputtering, evaporation, molecular beam epitaxy (MBE), etc., or chemical vapor deposition (CVD) including plasma CVD, etc., or other processes.

Certain elements or oxides of the superconductor may be deposited together because they do not have a high vapor pressure, and therefore, can be deposited without hard evaporation even by simultaneous deposition, or if desired may be separately deposited, particularly CuO.

The thickness of the film having a low vapor pressure of the oxide or element is 50 nm to 200 nm.

The order of the deposition of the films is preferably: first depositing an oxide having a low vapor pressure directly on a substrate so that adhesion of the film to the substrate is firm; and last depositing an oxide having a low vapor pressure as the top film of the stack to prevent evaporation of oxide or element having a high vapor pressure from the top of the stack during the heat treatment in order to form the perovskite type superconductor.

The stack of the films may have a composition which is stepwise or gradually changed from one film to an adjacent film.

The number of films in the stack is not limited, and a combination of a film of an oxide having a high, vapor pressure and a film of an oxide having a low vapor pressure may be repeatedly stacked.

The stack thus obtained is heat treated at a temperature higher than the temperature at which the oxide was deposited. By this heat treatment, a perovskite type superconductor is formed having an approximately stoichiometric composition and containing the high Tc phase at a high volume fraction. After the heat treatment, the amount of the oxide having a high vapor pressure may be lower than that of the as-deposited stack. Particularly the content of Pb is often reduced or even completely lost after the heat treatment, but a high volume fraction of the high Tc phase is obtainable. This suggests that Pb acts as an accelerator for forming the high Tc phase and is not necessarily a component of the high Tc phase. A separate formation of the PbO film is an important feature of the present invention. A preferred content of the PbO in the as-deposited stack has been described.

The temperature of the heat treatment is 835° C. to 870° C. At a temperature lower than 835° C., a low Tc phase superconductor is also formed, and at a temperature higher than 870° C., the superconductor may be melted.

In accordance with the present invention, among elements constituting a perovskite type superconductor, an oxide of an element having a high vapor pressure and difficult to deposit or an element or oxide which is relatively easily evaporated during a post-annealing of the deposited film is independently and concentratedly deposited, and thus the time for depositing such an oxide is shortened and variations of the composition by evaporation during the deposition and the annealing of the deposited film or stack can be reduced or neglected. By depositing an oxide with a low vapor pressure immediately on the above oxide, evaporation of the stack as a whole is also largely prevented. Thus, in accordance with the present invention, the composition of the film is very precisely controlled and a perovskite type superconductor having a high Tc and a high Jc is finally obtained.

Also, in accordance with the present invention, particularly by adding to an as-deposited film or stack an appropriate amount of Pb and a slightly excess amount of CuO, Bi-(Pb)-Sr-Ca-Cu-O system, superconductor which is almost a single phase of the high Tc phase, and therefore, has a high Tc and a high current density, is obtained after a heat treatment or annealing. This is a most important feature and effect of the present invention.

EXAMPLES

In the following Working Examples 1–2 and Comparative Examples 1–2, depositions were carried out by a RF magnetron sputtering under the following conditions:

Substrate: Single crystal (100) MgO;
Temperature of substrate: 400° C.;

Atmosphere: A mixed gas of Ar and $O_2$ with Ar:$O_2$=1:1;
Pressure: 1 Pa;
RF power: 100 W (about 1.3 W/cm$^2$);
Target A: $Bi_2Sr_2Ca_2Cu_3O_z$ sintered at 800° C. for 24 hours;
Target B: $Bi_2Pb_{0.4}Sr_2Ca_2Cu_3O_z$ sintered at 800° C. for 24 hours;
Target C: $Bi_2O_3$;
Target D: $PbO_x$.

Comparative Example 1

A film was deposited from the target A (Bi:Sr:Ca:Cu= 2:2:2:3) onto a MgO substrate heated at 400° C. to a thickness of 1 μm, and then heated in air at 875° C. for 5 hours.

FIG. 1 shows the X-ray diffraction pattern of the heat-treated sample. It is seen from FIG. 1 that the phase of $Bi_2Sr_2CuO_x$ having a Tc of 10K and the low Tc phase of $Bi_2Sr_2CaCu_2O_x$ having a Tc of 80K were formed. The composition of the film determined by EPMA was Bi:Sr:Ca:Cu=0.63:1.00:1.07:1.40, in which the content of Bi was remarkably decreased from the composition of the target of Bi:Sr:Ca:Cu=2:2:2:3.

Comparative Example 2

A film was deposited from the target B (Bi:Pb:Sr:Ca:Cu= 2:0.4:2:2:3) onto a MgO substrate heated at 400° C. to a thickness of 1 μm, and then heated in air at 850° C. for 12 hours.

Figure 2:
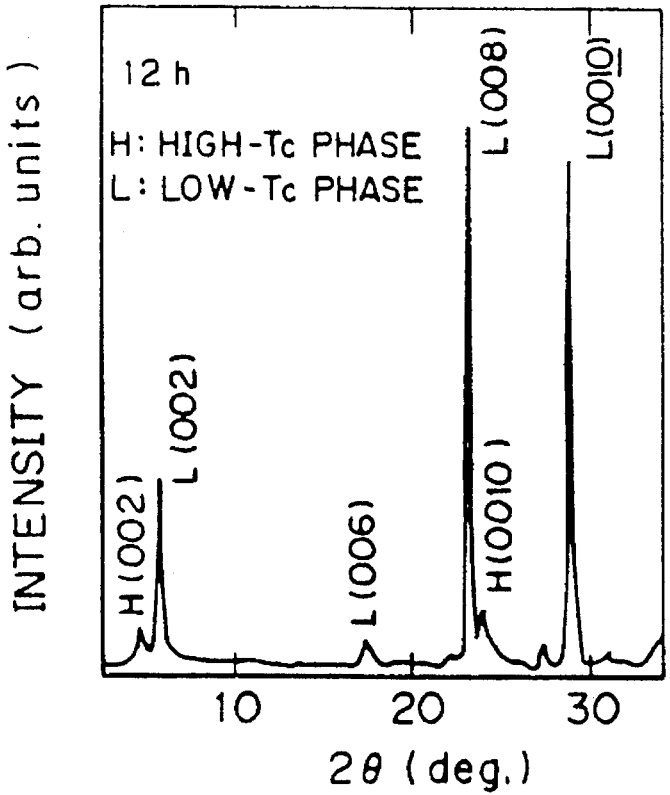
Figure 3:
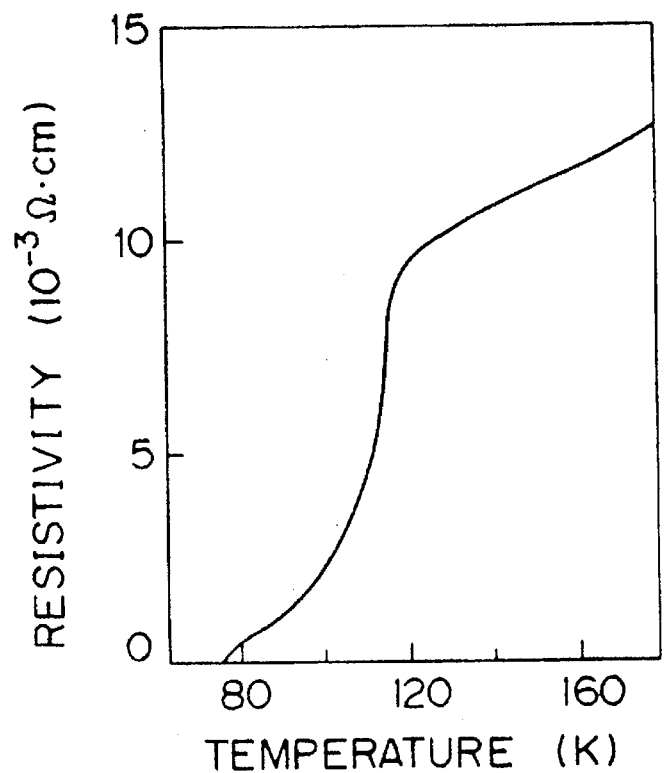
FIG. 3 shows the electric resistivity v.s. the temperature of a Bi-Pb-Sr-Ca-Cu-O superconductor film in the prior art.

FIG. 2 shows the X-ray diffraction pattern of the above heat treated sample. It is seen from FIG. 2 that the high Tc phase of $Bi_2Sr_2Ca_2Cu_3O_z$ was formed but the volume fraction thereof was still very low in comparison with the volume fraction of the low Tc phase of $Bi_2Sr_2CaCu_2O_x$.

FIG. 3 shows the electric resistivity dependence on the temperature in which the on-set temperature was higher than 110K but the Tce (end point of the critical temperature) was 75K.

The composition of the film was determined by EPMA and it was found that Bi was lacking and the composition was non-stoichiometric, and that only a little Pb was doped in the deposited film (therefore, it is understood that the content of Pb was not enough to form a high Tc phase).

Working Example 1

A film was deposited from the target A (Bi:Sr:Ca:Cu= 2:2:2:3) and the target C ($Bi_2O_3$) onto a MgO substrate heated at 400° C. to form a stack of five films of Bi-Sr-Ca-Cu-O, 200 nm thick, and three films of $Bi_2O_3$, 15 nm thick, the stack having a total thickness of 1 μm, and then heated in air at 875° C. for 5 hours.

The EPMA analysis revealed that the annealed film had a composition very close to the stoichiometric composition of the high Tc phase, i.e., the content of Bi was adequately compensated.

Nevertheless, it was also revealed that the high Tc phase was formed only in a very little amount such that it could be only just detected.

Working Example 2

Figure 4:
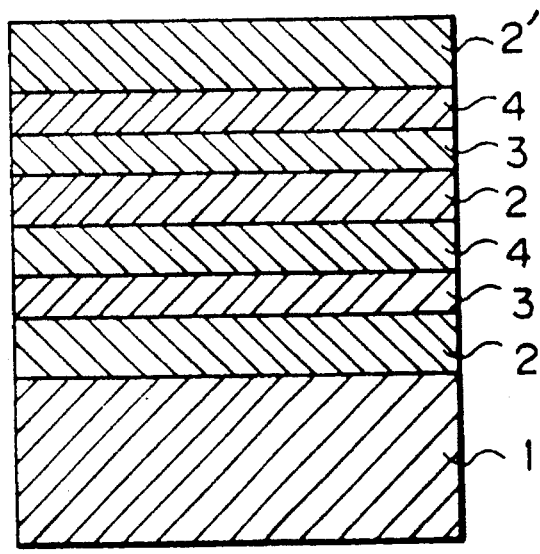
FIG. 4 shows a structure of an as-deposited stack of the present invention.

FIG. 4 illustrates a layer structure of the stack formed in this example, in which a plurality of a Bi-Sr-Ca-Cu-O film 2, a $Bi_2O_3$ film 3 and a PbO film 4, in this order, are deposited on a MgO substrate 1 and another Bi-Sr-Ca-Cu-O film 2' is finally deposited on the top of the stack of the films 2, 3 and 4.

The above deposition was carried out by magnetron sputtering using the targets A, C and D. The thicknesses of the Bi-Sr-Ca-Cu-O film 2, the $Bi_2O_3$ film 3, and the PbO film 4 were 300 nm, 20 nm and 10 nm, respectively, and the total thickness of the stack was about 1 μm. The thus-obtained stack was heat treated in air at 850° C. for 10 minutes to 15 hours.

The composition of the film after 1 hour heat treatment at 850° C. was Bi:Pb:Sr:Ca:Cu=0.87:0.34:1.00:1.27:1.88, (or 1:0.39:1.15:1.46:2.16), by EPMA. This clearly suggests that the amount of Bi was adequate and a sufficient amount of Pb was doped in the film.

It was found that, in this example, the Pb continuously evaporated during the heat treatment of the stack and only a little amount of Pb remained after 3 hours at 850° C. The as-deposited oxide films were amorphous, but reacted to form the high Tc phase after the heat treatment at 850° C. for 10 minutes, the volume fraction of the high Tc phase in the reacted film being one third. After 1 hour, more than half of the film was high Tc phase, and after 15 hours, only a little amount of Pb remained but the film was almost entirely high Tc phase only. This suggests that Pb accelerates the formation of the high Tc phase but the formation of the high Tc phase does not always require Pb.

Figure 5:
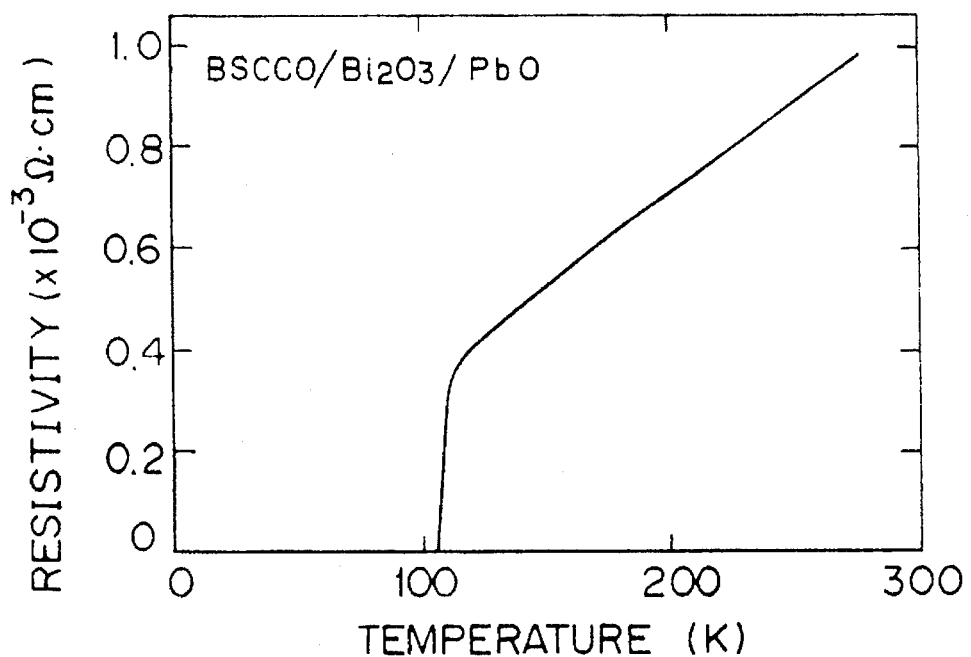
FIG. 5 shows the electric resistivity v.s. the temperature of a Bi-Pb-Sr-Ca-Cu-O superconductor film of the present invention.

FIG. 5 shows the electric resistivity v.s. the temperature of the thus-obtained film. As seen in FIG. 5, the electric resistivity is linearly decreased with a lowering of the temperature, and rapidly decreased at around 110K. The Tce of the film was 94.5K after 10 minutes heat treatment at 850° C. and 106.5K after 1 hour heat treatment. After 15 hours heat treatment at 850° C., the Tce of the film was 105.4K and almost the same as that after 1 hour heat treatment, but the on-set temperature was slightly elevated.

Figure 6:
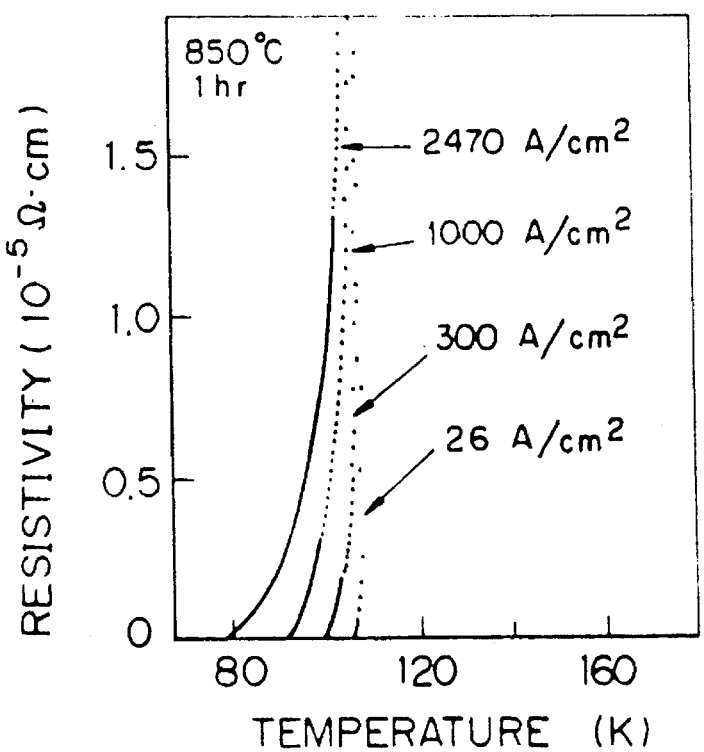
FIG. 6 shows the electric resistivity v.s. the temperature of a Bi-Pb-Sr-Ca-Cu-O superconductor film of the present invention at several the current densities.

FIG. 6 shows the temperature dependence of the electric resistivity in relation to the current density. It is seen that a satisfactory characteristic was obtained 2.47×10$^3$ A/cm$^2$ at the liquid nitrogen temperature.

As understood from the above, in the process of the prior art, magnetron sputtering was carried out by using a single target ($Bi_2Sr_2Ca_2Cu_3O_z$) and the resultant film then heat-treated in an oxide-containing atmosphere at a certain temperature, and the resultant film has a nonstoichiometric composition due to a lack of Bi. When a single target ($Bi_2Pb_{0.4}Sr_2Ca_2Cu_3O_z$) doped with Pb, which is said to accelerate the formation of the high Tc phase, is used in a similar process, the resultant film also has a nonstoichiometric composition due to a lack of Bi, and an amount of Pb sufficient to form the high Tc phase is not deposited. As a result, the film obtained using a single target in the prior art is multiphase and has a very small volume fraction of the high Tc phase.

In contrast, in accordance with the present invention, a plurality of targets including a sintered target ($Bi_2Sr_2Ca_2Cu_3O_z$, $Bi_2Pb_{0.4}Sr_2Ca_2Cu_3O_z$, etc.) for depositing a complex oxide containing the elements constituting the perovskite type superconductor; a compensating target ($Bi_2O_3$, $Tl_2O_3$, etc.) for depositing a compensating film to compensate for a component which, among the elements constituting the superconductor, has a high vapor pressure at a temperature of the film deposition or at a temperature of the heat treatment or annealing, and evaporates during the steps such that the content thereof is very low in the deposited or heat treated film; and a target of a high Tc phase formation accelerating component (PbO$_x$, etc.) for supplying a high Tc phase formation accelerating component such as PbO$_x$, which is not an essential component of the high Tc phase of the superconductor and has an effect of accelerating the formation of the high Tc phase but easily evaporates at the deposition or heat treatment temperature as above; etc., are used to form a stack of a plurality of films on a substrate and then heat treated or annealed. This, process of the present invention obtains the following effects.

1) A component such as Bi and Tl can be adequately compensated, so that the composition of the formed superconductor film can be stoichiometric.

2) A sufficient amount of Pb for accelerating the formation of the high Tc phase can be doped.

3) Due to the composition of the superconductor film close to that of the high Tc phase and a sufficient amount of Pb doped, as attained in the above 2) and 3), a superconductor film exhibiting a high quality high Tc phase can be formed by an extremely short time heat treatment.

Working Example 3

Figure 7:
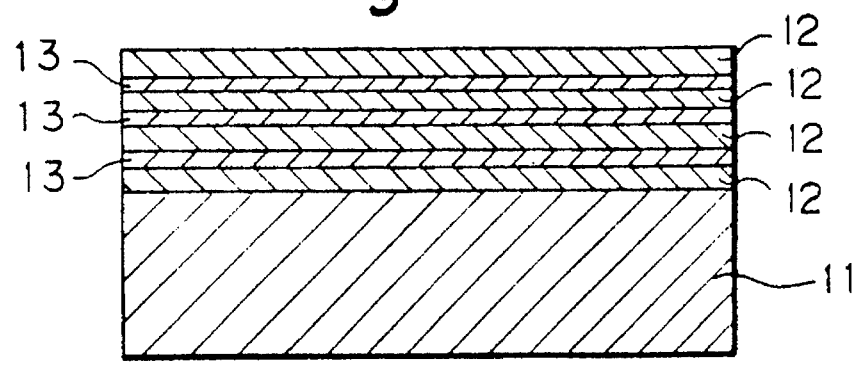
FIG. 7 shows a structure of another as-deposited stack of the present invention.

A stack of films having a structure as shown in FIG. 7 was formed on a single crystal MgO substrate by a magnetron sputtering. In FIG. 7, 11 denotes the substrate, 12 a Bi-Sr-Ca-Cu-O system film having a thickness of 200 nm, and 13 a PbO film having a thickness of 20 nm. There were four films 12 and three films 13. The following conditions were used in the magnetron sputtering:

Target E: a complex oxide with a ratio of Bi:Sr:Ca:Cu= 3:2:2:3

Atmosphere: a mixed gas of Ar and O$_2$ with a ratio of Ar/O$_2$ of 2/1

Pressure: 1 Pa

RF power: 100 W for the Bi-Sr-Ca-Cu-O film and 75 W for the PbO$_x$ film

Temperature of substrate: 400° C.

The thus-obtained stack or film was composition evaluated by an ICP (induced coupled plasma) and found to have a ratio of Bi:Pb:Sr:Ca:Cu=0.9:0.8:1.0:1.2:1.7 (or 1:0.89:1.11:1.33:1.89). The amount of Bi was adequate due to a high content thereof in the target. The ratio between Pb and Bi was 0.9:1.0, which is almost adequate.

The stack was then heat-treated in air at 850° C. for 10 minutes.

Similarly, the stacks were formed as above and then heat treated in air at 850° C. for 1 hour and 15 hours.

Figure 8:
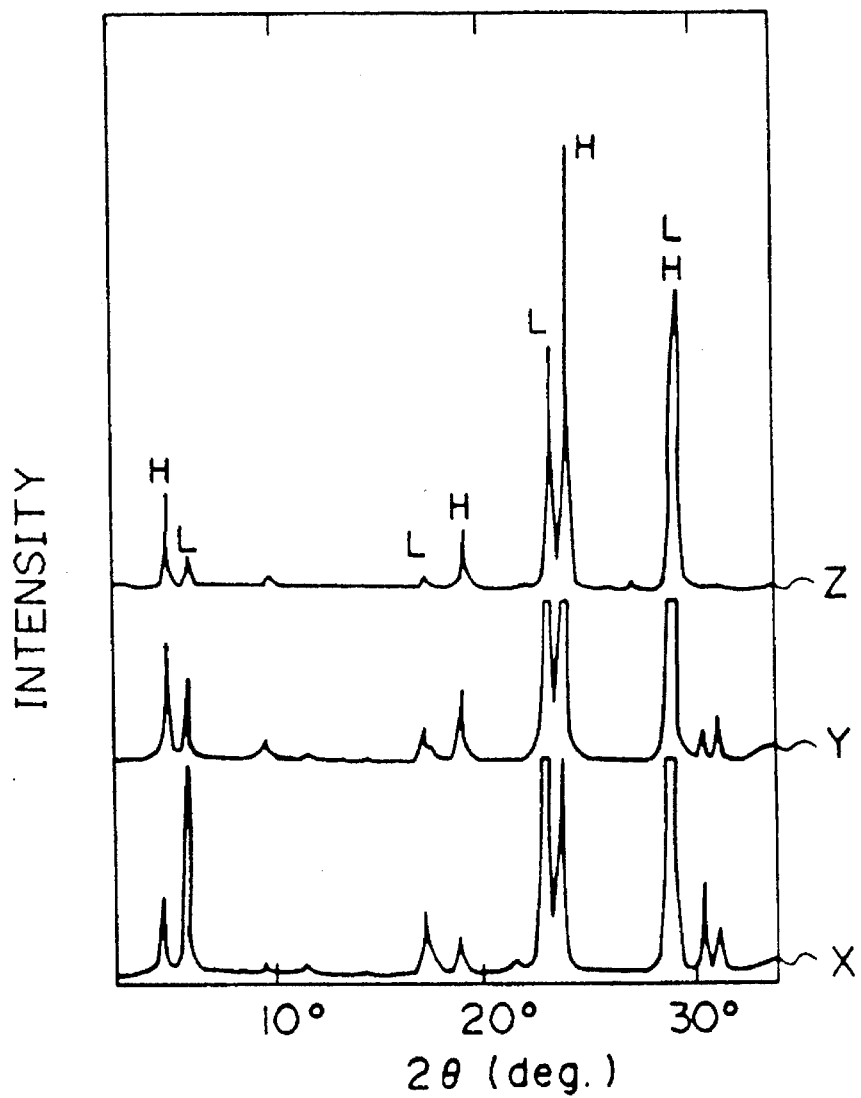
FIG. 8 shows X-ray diffraction patterns of Bi-Pb-Sr-Ca-Cu-O superconductor films of the present invention.

The thus obtained superconductor films X, Y, Z were analyzed by an X-ray diffraction and the X-ray diffraction patterns X, Y, Z are shown in FIG. 8, in which H denotes the high Tc phase having the Tc of 110K and L denotes the low Tc phase having the Tc of 80K. In all of the superconductor films heat-treated for different time periods, it is clear that a large high Tc phase was formed.

Figure 9:
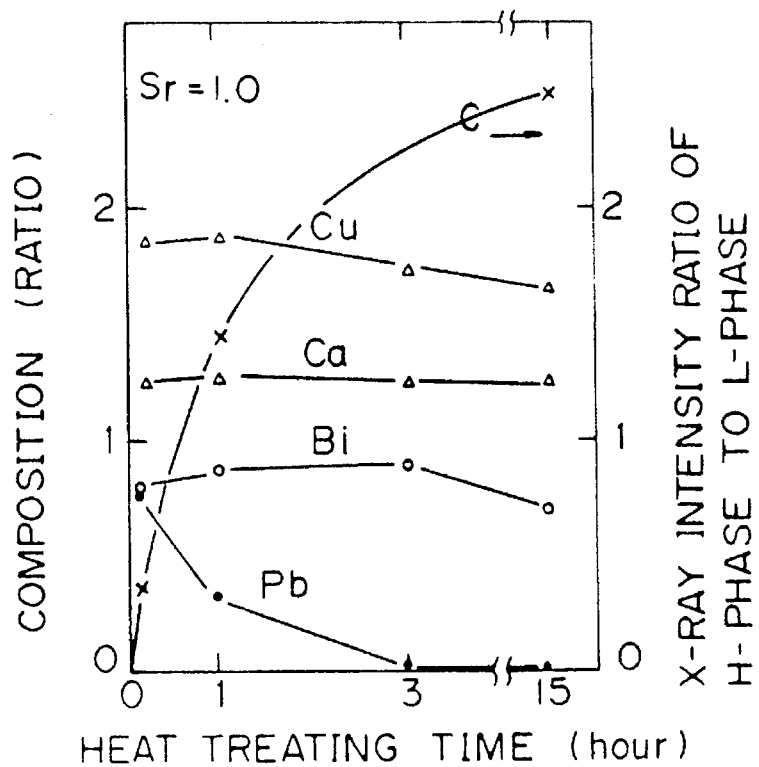
FIG. 9 shows the composition of a Bi-Pb-Sr-Ca-Cu-O system superconductor film during a heat treatment.

FIG. 9 shows the composition of the superconductor film in relation to the heat treatment time, evaluated by EPMA. Along with the time of the heat treatment, Pb is rapidly evaporated and disappears from the film in about 3 hours. On the other hand, the X-ray diffraction patterns indicates that the high Tc phase was rapidly formed at the beginning of the heat treatment, i.e., when Pb existed. In FIG. 9, the left side ordinate represents the composition ratio and the right side ordinate represents the X-ray diffraction intensity ratio of the high Tc phase peak (002) to the low Tc phase peak (002). With reference to FIG. 9, it is clear that the ratio of the high Tc phase peak to the low Tc phase peak increases with the heat treating time. Manifestly, it can be determined from FIG. 9 that the ratio is about 1.5 at a heat treating time of 1 hour and about 2.5 at a heat treating of 15 hours.

Figure 10:
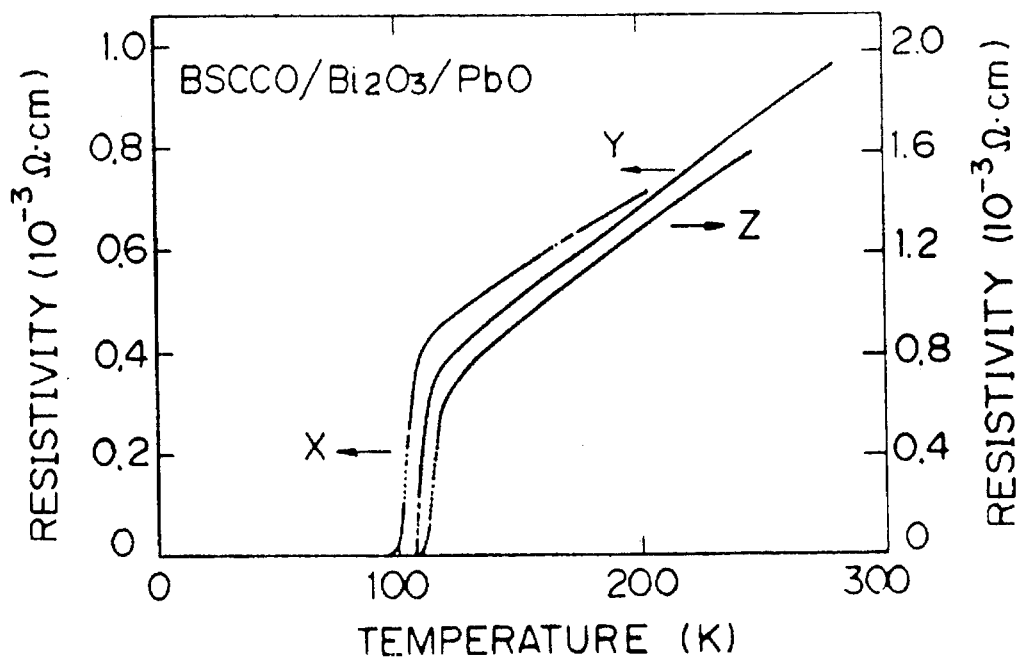
FIG. 10 shows the electric resistivity v.s. the temperature of a Bi-Pb-Sr-Ca-Cu-O superconductor films of the present invention.

FIG. 10 shows the electric resistivities of the superconductor films X, Y, Z in relation to the temperature. The highest Tce was 106.5K after a 1 hour heat treatment at 850° C.

Comparative Example 3

The procedures of Working Example 3 were repeated except that the deposited stack had a ratio of Bi/Pb of 1/0.2 by reducing the thickness of the PbO film 13 from 30 nm to 6 nm.

The following is the change of the composition occurring during the heat treatment, as determined by EPMA.

| Sample No. | Time of heat treatment | Bi:Pb:Sr:Ca:Cu |
| --- | --- | --- |
| 1 | 10 minutes | 1.02:0.21:1.00:1.08:2.26 |
| 2 | 1 hour | 1.00:0.14:1.00:1.02:1.76 |
| 3 | 15 hours | 0.91:0.10:1.00:1.09:1.55 |

Figure 11:
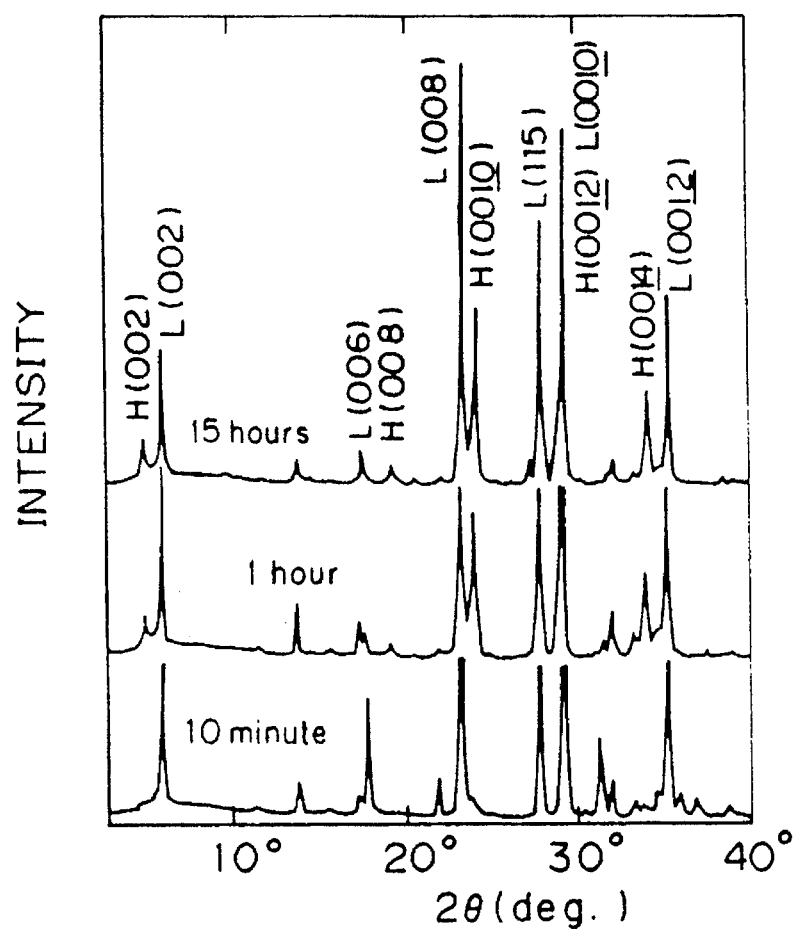
FIG. 11 shows X-ray diffraction patterns of Bi-Pb-Sr-Ca-Cu-O superconductor films of the prior art.

FIG. 11 shows the X-ray diffraction patterns of the above three superconductors. It is clear that the amount of the high Tc phase was not increased by the prolongation of the heat treatment.

Figure 12:
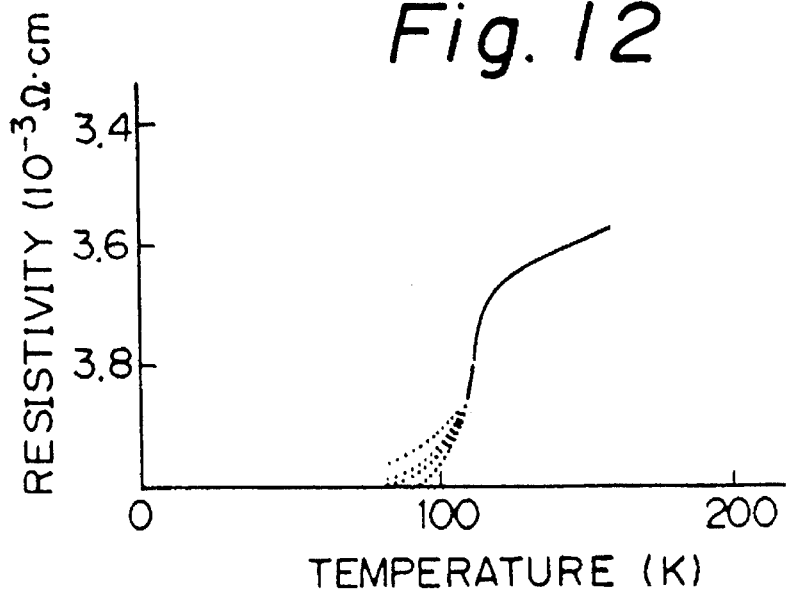
FIG. 12 shows the electric resistance v.s. the temperature, of Bi-Pb-Sr-Ca-Cu-O superconductor films of the prior art.

FIG. 12 shows the electric resistivity of the superconductor film in relation to the temperature. The on-set temperature is 110K but the end point Tce is 77K.

Working Example 4

Figure 13:
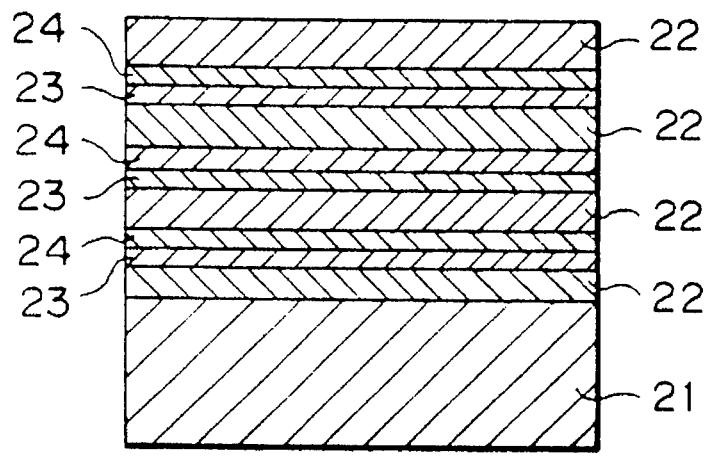
FIG. 13 shows a structure of a further as-deposited stack of the present invention.

A stack of films having a structure as shown in FIG. 13 was formed on a single crystal MgO substrate by magnetron sputtering. In FIG. 13, 21 denotes the substrate, 22 a Bi-Sr-Ca-Cu-O system film having a thickness of 200 nm, 23 a PbO$_x$ film having a thickness of 30 nm and 24 a CuO film having a thickness of 30 nm. There were four films 22 and three films 23 and 24. The following conditions were used in the magnetron sputtering:

Target E: a complex oxide with a ratio of Bi:Sr:Ca:Cu= 3:2:2:3

Atmosphere: a mixed gas of Ar and O$_2$ with a ratio of Ar/O$_2$ of 2/1

Pressure: 1 Pa

RF power: 100 W for the Bi-Sr-Ca-Cu-O film and 75 W for the PbO$_x$ film and CuO film Temperature of substrates 400° C.

The composition of the thus-obtained stack or film was evaluated by an ICP (induced coupled plasma) and found to have a ratio of Bi:Pb:Sr:Ca:Cu=1.0:0.8: 1.0:1.0:1.6. The amount of Bi was adequate (just the stoichiometric ratio to Sr).

Figure 14:
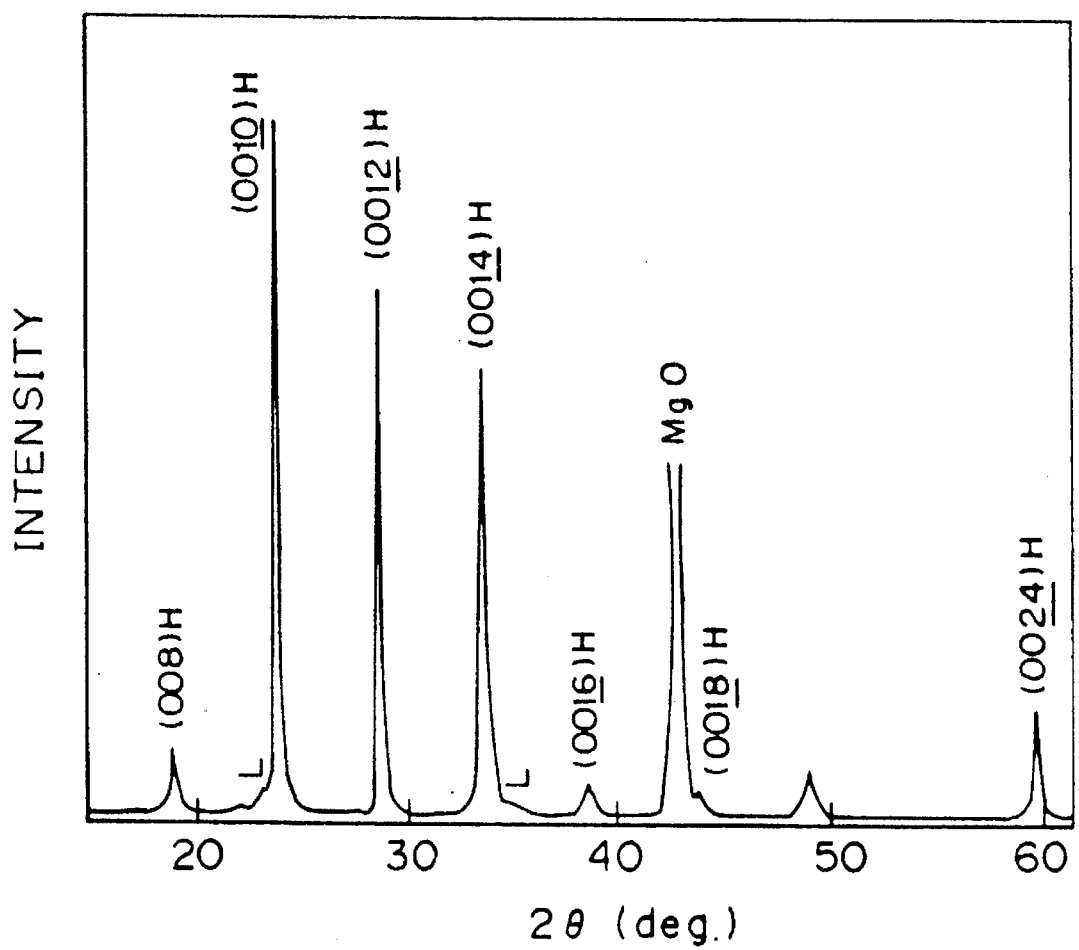
FIG. 14 shows an X-ray diffraction pattern of a Bi-Pb-Sr-Ca-Cu-O system superconductor film of the present invention.

The obtained stack was then heat treated in air at 850° C. for 1 hour and a superconductor film was obtained. FIG. 14 shows the X-ray diffraction pattern of the superconductor film. It is seen that an almost single phase of the high Tc phase of the superconductor was obtained.

Figure 15A:
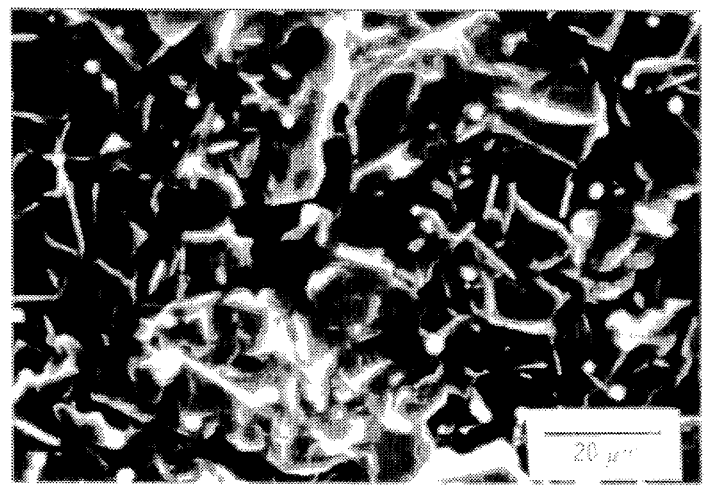
FIGS. 15A and 15B show microstructures of a Bi-Pb-Sr-Ca-Cu-O system superconductor film of the present invention.
Figure 15B:

FIGS. 15A and 15B show microstructures of the superconductor film observed by a scanning electron microscope (SEM), in which c-axis aligned scaly superconductor crystals are seen.

Figure 16:
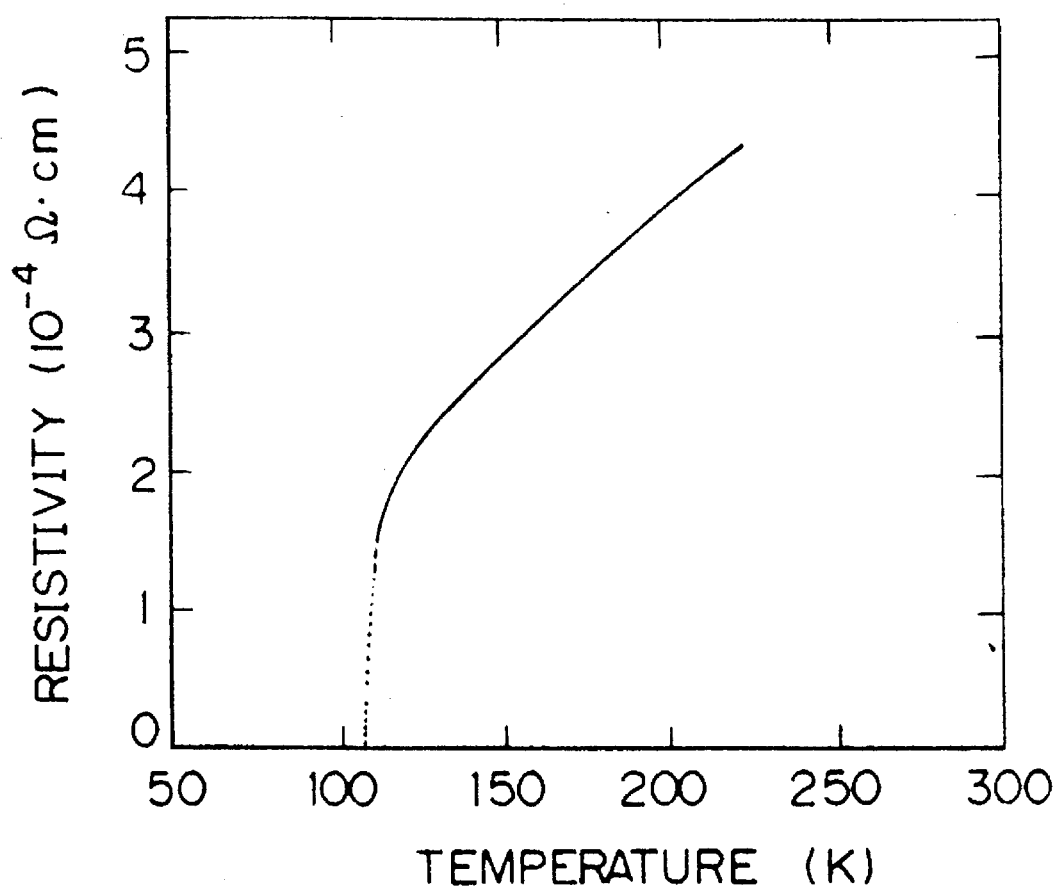
FIG. 16 shows the electric resistance v.s. the temperature of a Bi-Pb-Sr-Ca-Cu-O system superconductor film of the present invention.

FIG. 16 shows the electric resistivity of the superconductor film in relation of the temperature. The resistance was rapidly lowered from around 106.5K and reached zero resistivity at 106.5K.

The critical current density was high, $5.8 \times 10^4$ A/cm$^2$ at 77.3K.

Working Example 5

Superconducting films were deposited by RF magnetron sputtering with three targets. The films were deposited on 20×20 mm$^2$ MgO (100) single crystals. We used a Bi-Sr-Ca-Cu-O (BSCCO) target with the composition of Bi:Sr:Ca:Cu=3:2:2:3. The film Bi content is usually less than the target value, and a Bi-rich target is usually used to compensate for the lack of Bi in the films. PbO and CuO targets were also used to dope enough Pb into the films and to optimize the Cu content. PbO and CuO layers were stacked repeatedly on BSCCO layers to precisely control composition. The PbO and CuO layers were several dozen nanometers thick. The total thickness of the deposited films was about 0.85 μm.

As-deposited films were amorphous and insulating. A film was divided into about 10×10 mm$^2$ samples, and one of these was analyzed by inductively coupled plasma analysis (ICP) to determine the film composition. The other films were sintered in air for 1 h around 850° C. A muffle furnace was used and the temperature was measured by an R-type (Pt-13% Rh, Pt) thermocouple. The heating rate was 10°/min to 800° C. and 1°/min above that to avoid overshooting the set temperature. During heating, the films were kept at 800° C. for 20 min. The films were cooled at 10°/min. The films were examined using X-ray diffraction with a Cu Kα source and a scanning electron microscope. The electrical resistivity of the films was also measured with the four-point probe method using dc current.

We doped the films heavily with Pb because it promoted the high Tc phase. As-deposited film compositions are listed in the following Table. Number 134 was Pb doped to the stoichiometric film at a ratio of 1.03 to the Sr content. X-ray diffraction showed that after 1 h of sintering at 852° C., large amounts of the film transformed to the high Tc phase, but about one-fourth of the film remained in the low Tc phase. In addition to superconducting crystals, needle-like precipitations several dozen microns long were observed with a scanning electron microscope (SEM). Heavy Pb doping deteriorates the film morphology because the film melts more easily during sintering as the Pb content increases. This causes an inhomogeneous distribution of the elements and forms needle-like crystals which were found to be Ca-Cu-O by electron probe microanalysis (EPMA) and led to a low critical current density (Jc). We found that in thin films the Cu content decreased by about 3% during an hour of sintering.

Figure 17:
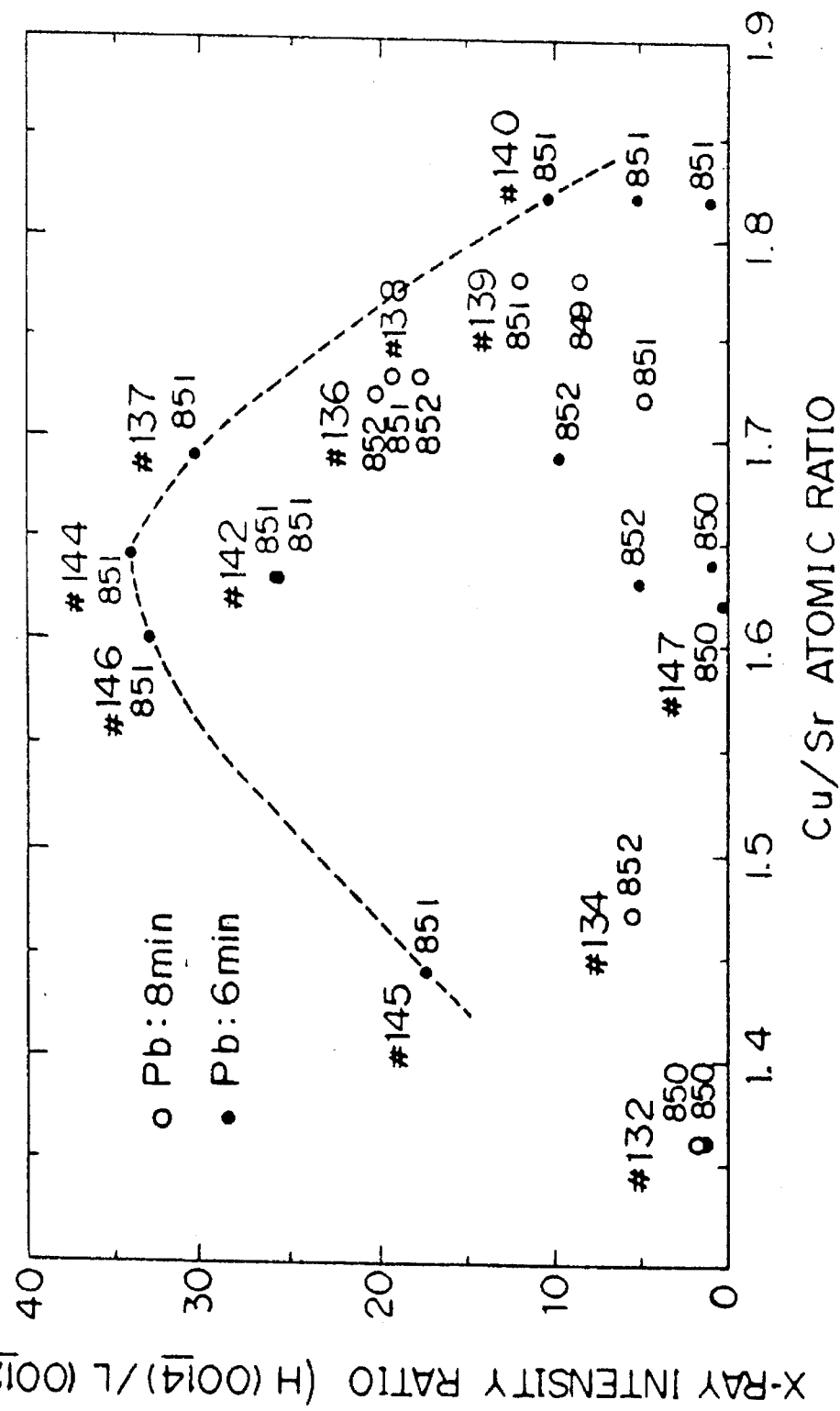
FIG. 17 shows X-ray intensity ratios of high Tc/low Tc at several Cu/Sr and Pb/Bi ratios.

We then attempted to decrease the amount of Pb doping and investigated the Cu composition dependence of the high Tc phase formation. FIG. 17 shows the intensity ratios of the peaks from the high Tc phase (0014) and the low Tc phase (0012). Similar results are obtained from the ratios of H(002)/L(002) and H(0010)/L(008).

TABLE

Atomic compositions of Bi, Pb, Sr, Ca, and Cu determined by ICP, normalized by the Sr composition. For the upper samples, PbO target was sputtered for 8 min and for the lower, 6 min. BSCCO target was sputtered for 100 min and CuO from 15 to 24 min.

| Run No. | Compositions Bi:Pb:Sr:Ca:Cu |
|---|---|
| 128 | 0.90:1.19:1.00:0.98:1.35 |
| 132 | 0.93:1.10:1.00:1.02:1.36 |
| 134 | 0.96:1.03:1.00:1.09:1.47 |
| 136 | 0.99:1.11:1.00:1.04:1.72 |
| 138 | 0.95:1.04:1.00:0.98:1.73 |
| 139 | 0.95:1.09:1.00:1.05:1.78 |
| 145 | 0.93:0.78:1.00:0.96:1.44 |
| 146 | 0.96:0.79:1.00:0.98:1.60 |
| 147 | 1.01:0.85:1.00:0.99:1.62 |
| 142 | 0.98:0.82:1.00:0.96:1.63 |
| 144 | 1.02:0.80:1.00:0.99:1.64 |
| 137 | 1.00:0.84:1.00:1.01:1.69 |
| 140 | 1.03:0.89:1.00:1.02:1.82 |

In FIG. 17, the large number indicate run number and the small numbers indicate sintering temperature. Dotted line is a guide for the eye. The amount of the high Tc phase depends strongly on the Cu content. The sintering temperature also greatly affects the amount of the high Tc phase formed. The low Tc phase forms below 848° C. and above 853° C. This suggests that the single-phase high Tc film forms in a very narrow temperature range. For Bi:Pb:Sr:Ca:Cu= 1.00:0.80:1.00:0.99:1.64, we obtained a nearly single-phase high Tc thin film after an hour of sintering at 851° C. in air. The resistivity decreased linearly with temperature and had a zero resistance at 06.5K. Jc reached $4.1 \times 10^4$ A/cm$^2$ at 77.3K with a criterion of 1 μV/cm.

We claim:

1. A process for preparing a film of a perovskite Bi-(Pb)-Sr-Ca-Cu-O system superconductor containing more high Tc phase, wherein the atomic ratio of Bi:Sr:Ca:Cu is 2:2:2:3, than low Tc phase, wherein the atomic ratio of Bi:Sr:Ca:Cu is 2:2:1:2 and 2:2:0:1, on a substrate, said process comprising:

depositing a film on a substrate, said film as deposited having an average composition wherein the atomic ratio of Bi:Pb:Sr:Ca:Cu is 0.8–1.1:0.5–1.0:1:0.9–1.1:1.5–1.7;

heat treating said film in an oxygen containing atmosphere to form said superconductor film; and establishing a Bi/Pb ratio in said as deposited film which is less than 1.275 effective for causing the average composition of the heat treated superconductor film, in terms of the atomic concentrations of the elements thereof other than Pb, to vary by not more than 10% from the stoichiometric values for said high Tc phase Bi-(Pb)-Sr-Ca-Cu-O system superconductor, wherein said formed superconductor film has a ratio of said high Tc phase superconductor to said low Tc phase superconductor within the range of from about 1.5 to about 2.5.

2. A process according to claim 1, wherein said film as deposited has an average composition including a ratio of Sr/Cu of 1/1.5 to 1/1.7.

3. A process according to claim wherein the perovskite system is represented by the formula $Bi_2(Sr_{1-x}Ca_x)_mCu_nO_z$, where $0<x<1$, $m=3$ and $n=2$, or $m=4$ and $n=3$, and $z>0$.

4. A process according to claim 1, wherein said film as deposited comprises a stack of layers, said stack of layers including a layer of at least one of Pb oxide, $Bi_2O_3$ and CuO.

5. A process according to claim 4, wherein said stack of layers as deposited has an average composition including a ratio of Sr/Cu of 1/1.5 to 1/1.7.

6. A process as set forth in claim 1, wherein said Bi/Pb ratio is in the range of from 0.7563 to 1.275.

7. A process as set forth in claim 1, wherein said Bi/Pb ratio is 0.8.

* * * * *

UNITED STATES PATENT AND TRADEMARK OFFICE
CERTIFICATE OF CORRECTION

PATENT NO. : 5,585,332
DATED : December 17, 1996
INVENTOR(S) : Tanaka et al.

It is certified that error appears in the above-indentified patent and that said Letters Patent is hereby corrected as shown below:

OTHER PUBLICATIONS, Page 2, Column 1, line 6, delete "pp. 1041-1043" and substitute --pp. L 1041-1043--.

Column 1, line 61, delete "reproduciblly" and substitute --reproducibly--.

Column 4, line 20, delete "rs." and subtitute --vs.--

Column 5, line 1, delete "n=2, or" (2nd occurrence);
         line 35, delete "o";
         line 48, delete "1.151.5" and substitute --1.1:1.5--.

Column 6, line 13, delete "high," and substitute --high--;
         line 29, delete "present.invention" and substitute --present invention--.

Column 7, line 21, after "formed.", insert new paragraph.
         line 61, delete "Just" and substitute --just--.

UNITED STATES PATENT AND TRADEMARK OFFICE
CERTIFICATE OF CORRECTION

PATENT NO. : 5,585,332
DATED : December 17, 1996
INVENTOR(S) : Tanaka et al.

It is certified that error appears in the above-indentified patent and that said Letters Patent is hereby corrected as shown below:

Column 9, line 9, delete "This," and substitute --This--.

Column 10, line 9, after "treating", insert --time--;
         line 61, delete "substrates" and substitute --substrate:--.

Column 12, line 36, delete "06.5K" and substitute --106.5K";
         line 65, after "claim", insert --1--.

Signed and Sealed this

Fifteenth Day of April, 1997

BRUCE LEHMAN

*Attest:*

*Attesting Officer*    *Commissioner of Patents and Trademarks*